United States Patent
Janardhanan et al.

(10) Patent No.: US 8,085,074 B1
(45) Date of Patent: Dec. 27, 2011

(54) FAST-LOCKING DELAY LOCKED LOOP

(75) Inventors: Jayawardan Janardhanan, Bangalore (IN); Samala Sreekiran, Bangalore (IN); Sujoy Chakravarty, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 12/901,576

(22) Filed: Oct. 11, 2010

(51) Int. Cl.
*H03L 7/06* (2006.01)
(52) U.S. Cl. ........................ 327/158; 327/149
(58) Field of Classification Search .............. 327/149, 327/158
See application file for complete search history.

(56) References Cited

U.S. PATENT DOCUMENTS

| | | | | |
|---|---|---|---|---|
| 5,608,656 A * | 3/1997 | Purcell et al. | | 708/203 |
| 5,630,033 A * | 5/1997 | Purcell et al. | | 345/418 |
| 6,122,442 A * | 9/2000 | Purcell et al. | | 345/620 |
| 7,502,815 B1 * | 3/2009 | Drimer | | 708/255 |
| 7,627,806 B1 * | 12/2009 | Vijayaraghavan et al. | | 714/807 |
| 2005/0193045 A1 * | 9/2005 | Yamamoto et al. | | 708/250 |
| 2006/0133467 A1 * | 6/2006 | Clausen | | 375/219 |
| 2009/0028269 A1 * | 1/2009 | Pinkney | | 375/295 |

OTHER PUBLICATIONS

Yeon-Jae Jung, Seung-Wook Lee, Daeyun Shim, Wonchan Kim, Changhyun Kim and Soo-In Cho, "A Dual-Loop Delay-Locked Loop Using Multiple Voltage-Controlled Delay Lines", IEEE Journal of Solid-State Circuits, vol. 36, No. 5, Year May 2001, pp. 784-791.
"Chih-Kong Ken Yang", Delay-Locked Loops-An Overview, Phase Locking in High Performance Systems , IEEE Press, Year 2003, pp. 13-22.

* cited by examiner

*Primary Examiner* — Lincoln Donovan
*Assistant Examiner* — Adam Houston
(74) *Attorney, Agent, or Firm* — Ronald O. Neerings; Wade James Brady, III; Frederick J. Telecky, Jr.

(57) ABSTRACT

A fast locking delay-locked loop (DLL), which can also operate as a clock data recovery circuit (CDR), includes a delay chain, a sampling circuit and a transition detector. An input signal and delayed versions of the input signal generated by the delay chain are sampled by the sampling circuit. The outputs of the sampling circuit are provided to a transition detector which selects one of the input signal and its delayed versions determined to have signal transitions most closely aligned with a sampling edge of a clock. The selected signal and the clock are provided as inputs to a phase discriminator which generates an error signal representing a level of phase mismatch between the inputs. The error signal is fed back to the sampling circuit to maintain phase lock between the clock signal and the input bit stream.

17 Claims, 5 Drawing Sheets

FAST-LOCKING DELAY LOCKED LOOP

BACKGROUND

1. Technical Field

Embodiments of the present disclosure relate generally to delay locked loops (DLL), and more specifically to a fast-locking delay locked loop.

2. Related Art

A delay locked loop (DLL) is a closed-loop feedback circuit that adjusts the phase of its output to achieve a desired phase difference between the output and an input signal. The adjustment is typically done based on an error signal generated as a comparison result of the phases of the output and the input signal. The input signal and the output are typically clock signals.

The lock-time of a DLL is generally the time required for the output of the DLL to 'lock to' the input signal. Thus, for example, assuming the input signal is a clock, the lock-time is the time taken for the output of the DLL to be adjusted to have the desired phase difference from the phase of the input clock. The lock-time of a DLL may be expressed conveniently in terms of the number of clock cycles of an input clock.

It may generally be desirable that the lock-time of a DLL be short. For example, a clock data recovery (CDR) application may require an output clock of a DLL to be aligned with bit-boundaries of a serial data stream quickly (e.g., within an interval of the first few bit transitions representing a synchronization sequence transmitted at the beginning of the data stream), the output clock then being used to sample the data stream to recover the subsequent data bits.

SUMMARY

This Summary is provided to comply with 37 C.F.R. §1.73, requiring a summary of the invention briefly indicating the nature and substance of the invention. It is submitted with the understanding that it will not be used to interpret or limit the scope or meaning of the claims.

A delay locked loop (DLL) contains multiple delay elements, memory cells, logic gates and a phase discriminator. The delay elements delay an input bit stream and generate multiple delayed input bit streams. The memory cells form a sampling circuit, each of which is clocked by a same clock signal. The memory cells sample a corresponding bit stream contained in the delayed input bit streams and the input bit stream at an active edge of the clock signal. The logic gates determine a delay between the active edge of the clock signal and a bit boundary of the input bit stream within a time interval equal to an interval between a first transition of the input bit stream and an immediately next active edge of the clock signal, and select the bit stream having the determined delay. The bit stream with the determined delay is provided as an input to the phase discriminator. The phase discriminator compares the phase of the selected bit stream with the phase of the clock signal, and generates an error signal representing the phase difference between the phase of the selected bit stream and the phase of the clock signal. The error signal is fed back to the sampling circuit to maintain phase lock between the clock signal and the input bit stream.

Several embodiments of the present disclosure are described below with reference to examples for illustration. It should be understood that numerous specific details, relationships, and methods are set forth to provide a full understanding of the embodiments. One skilled in the relevant art, however, will readily recognize that the techniques can be practiced without one or more of the specific details, or with other methods, etc.

BRIEF DESCRIPTION OF THE VIEWS OF DRAWINGS

Example embodiments will be described with reference to the accompanying drawings briefly described below.

The drawing in which an element first appears is indicated by the leftmost digit(s) in the corresponding reference number.

DETAILED DESCRIPTION

Various embodiments are described below with several examples for illustration.

1. Example Device

Figure 1:
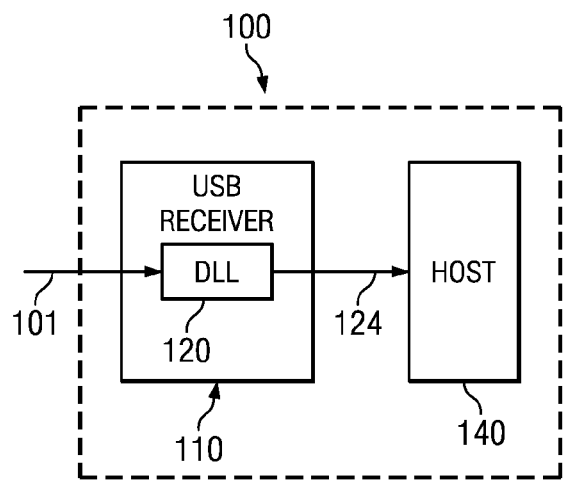
FIG. 1 is a block diagram illustrating the details of an example device in which several embodiments can be implemented.

FIG. 1 is a block diagram of an example device in which several embodiments of the present disclosure can be implemented. The diagram shows a device 100 containing host 140 and a universal serial bus (USB) receiver 110. Host 140 may correspond to a combination of a processor and sub-systems (such as memory) designed to provide a desired feature (e.g., a mobile phone). USB receiver 110 is designed to receive serial data streams according to USB format(s), process the data streams to recover data representing the streams, and to provide the data to host 140. Host 140 may further process the data in providing the desired feature.

USB receiver 110 is shown containing delay locked loop (DLL) 120, and receives a serial data stream according USB format on path 101. USB receiver 110 may additionally contain other components, such as those required for implementing USB receiver functionality, but not shown in FIG. 1 for conciseness.

DLL 120 operates to extract the data in the USB serial stream, and forwards the data bits to host 140 on path 124. As is well known in the relevant arts, a USB serial data stream is transmitted without an accompanying clock signal. Accordingly, USB receiver 110 (or DLL 120) may internally generate a clock signal with (approximately) the same frequency as the data rate of the USB stream, phase-aligns the sampling edges of the clock to the data-bit transitions in the USB data stream using DLL 120, and samples the data stream with the phase-aligned clock to recover the data bits in the data stream. DLL 120 thus operates as a clock data recovery (CDR) circuit in the example device of FIG. 1. However, in other systems or environments, DLL 120 may be used for other applications such as, for example, to phase-align an input clock or data stream with a locally generated clock.

Figure 2:
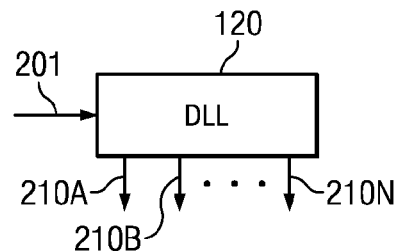
FIG. 2 is a diagram illustrating generation by a DLL of multiple clock phases from an input clock.

DLLs may also be used for generation of multiple phases from an input clock as illustrated with respect to FIG. 2. In FIG. 2, DLL 120 is shown receiving an input clock 201 and generating clocks 210A through 210N, each delayed by a corresponding phase delay with respect to clock 201.

In operating to recover data bits in the USB data stream received on path 201, DLL 120 may need to achieve phase-lock with the bit stream in a very short time. A USB data stream may contain a synchronization pattern (a string of logic 1s and 0s) to enable DLL 120 to achieve such phase lock. When such synchronization pattern is short (fewer number of bits), and also in general, the lock time of DLL 120 may need to be short. Several embodiments of the present disclosure provide such a fast-lock capability as described next.

2. Fast-Locking DLL

Figure 3:
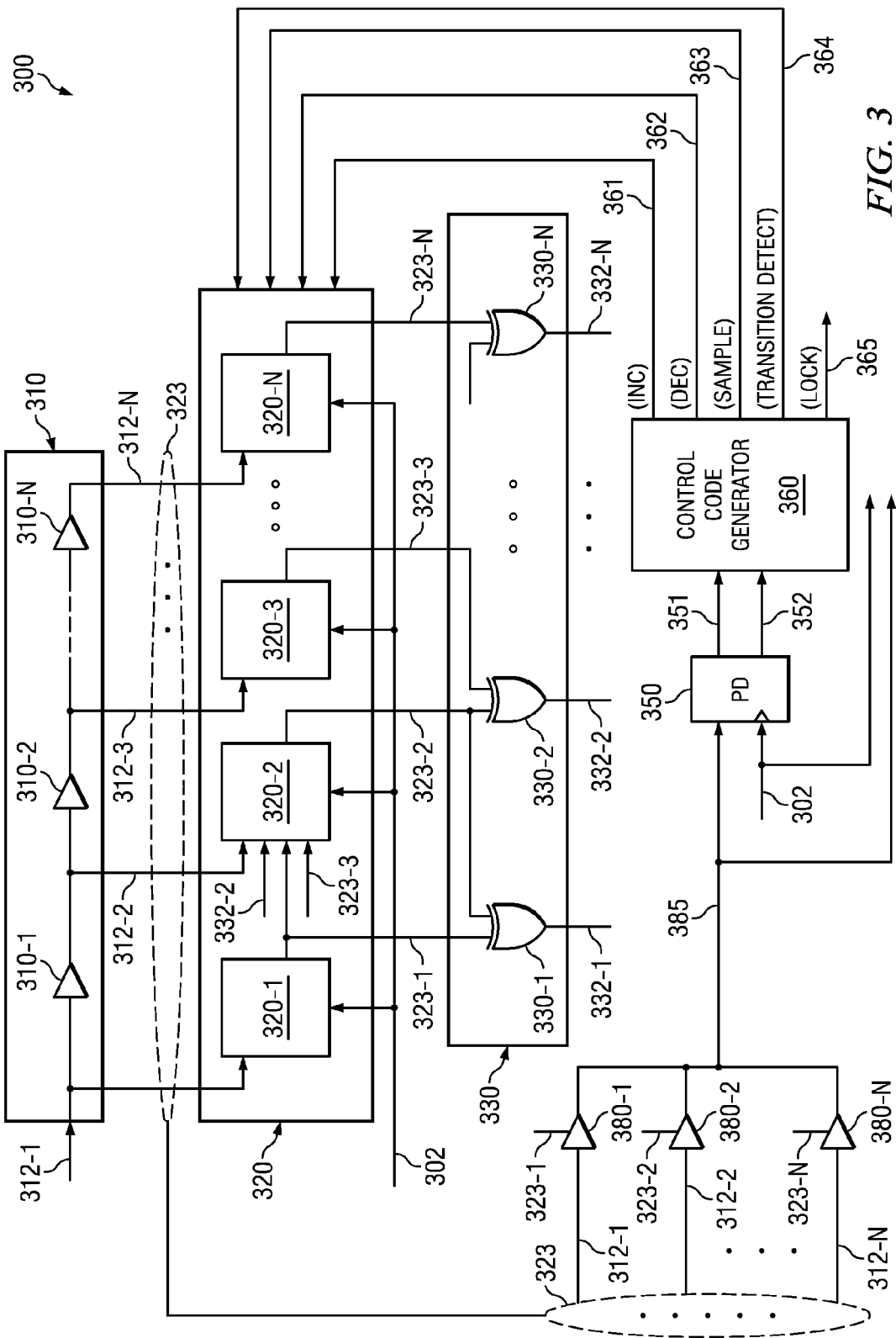
FIG. 3 is a block diagram of a DLL in an embodiment.

FIG. 3 is a block diagram of a DLL in an embodiment. DLL 300, which may be implemented in place of DLL 120 of FIG. 1, is shown containing delay chain 310, sampling circuit 320, transition detector 330, tri-state buffers 380-1 through 380-N, phase discriminator (PD) 350 and control code generator 360.

Delay chain 310 contains delay elements 310-1 through 310-N (first plurality of delay elements). Each of the delay elements may be designed to provide a same amount of delay. Delay element 310-1 receives an input on path 312-1 (input bit stream) and provides a delayed output on path 312-2. Delay element 310-2 receives an input on path 312-2, and provides a delayed output on path 312-3. Each of the other delay elements similarly receives an input and provides a corresponding delayed output. Thus, assuming, an input (data) bit-stream is received on path 312-1, corresponding multiple delayed input bit streams (with correspondingly greater delays) are provided on respective paths 312-2 through 312-N. Paths 312-1 through 312-N are together referred to as bus 323, and are also connected as corresponding inputs to the respective ones of tri-state buffers 380-1 through 380-N, as shown in FIG. 3.

In an embodiment, the delay elements are implemented such that the total delay (as measured at the output of delay element 310-N) provided by delay chain 310 to input 312-1 equals one clock period of a clock provided on path 302. The specific number of elements (i.e., value of 'N') may be chosen based on the level of accuracy with which phase-lock is required to be provided, or the value of delay that can be generated by each delay element.

Sampling circuit 320 contains storage cells 320-1 through 320-N (third plurality of memory cells), each clocked by a clock received on path 302. Each of the storage cells receives four data inputs and three control inputs (excluding clock 302), and operates to store the value of data on one of the four inputs at each sampling edge of clock 302. The nature of the four inputs is illustrated with respect to storage cell 320-2. Storage cell 320-2 receives as inputs bit-stream 312-2, output 323-1 of the preceding storage cell 320-1, output 323-3 of the next storage cell 320-3, and output 332-2 of the associated XOR gate 330-2. A multiplexer contained in storage cell 320-2 selects one of the four inputs specified by the corresponding ones of control signals 361 (INC), 362 (DEC), 363(SAMPLE), AND 364 (TRANSITION DETECT), and provides the selected input to the input (D) of a storage element (e.g., a flip-flop) contained within storage cell 320-2. The storage element stores the value of the selected input at each sampling edge of clock 302. Each of the other storage cells 320-1, 320-3 through 320-N are implemented similarly with corresponding inputs, but not shown for the sake of clarity in FIG. 3. The internal details of each storage cell is illustrated with respect to an embodiment in FIG. 7, and described below. Storage cells 320-1 through 320-N respectively provide the corresponding stored outputs (Q) on paths 323-1 through 323-N respectively.

Transition detector 330 contains XOR (exclusive-OR) gates 330-1 through 330-N (fourth plurality of logic gates). Each of the XOR gates receives as inputs the outputs of two successive storage cells in sampling circuit 320, and generates a logical XOR output of the two inputs. To illustrate, XOR gate 330-1 receives outputs 323-1 and 323-2 of respective storage cells 320-1 and 320-2, and provides the result of the XOR operation on path 332-1. The other XOR gates operate similarly. While transition detector 330 is shown implemented using XOR gates, other equivalent logic circuits can also be used instead.

Tri-state buffers 380-1 through 380-N receive respective inputs 312-1 through 312-N, and when enabled provide the corresponding input signal as an output on path 385 (first input path). The outputs of tri-state buffers are connected together to path 385. Tri-state buffers 380-1 through 380-N receive output-enable/tri-state signals on respective paths 323-1 through 323-N. As illustrated below with respect to FIG. 4, in operation, the output of only one of the tri-state buffers is enabled in any time interval, and corresponds to an input bit stream (among streams 312-1 through 312-N) whose data-bit transitions have zero (or near-zero) phase difference with the active edge of clock 302 (also provided as a clock to PD 350). The sampling edge of clock 302 represents the phase of clock 302. Similarly, a bit boundary or edge of a data bit stream also represents the phase of the data bit stream.

PD 350 operates to generate error signals 351 and 352 based on the phase delay between a bit transition on the bit stream on path 385 and the active edge of clock 302. The operation of PD 350, as well as the implementation in an embodiment, is described in sections below.

Control code generator 360 receives error signals 351 and 352, and generates bit-signals 361, 362, 363, 364 and 365 (digital control signals). At the commencement of operations of DLL 300 (e.g., following a RESET of DLL 300), signal 363 (SAMPLE) is set to logic one, and the storage elements in the storage cells receive corresponding signals 312-1 through 312-N. When signal 364 (TRANSITION DETECT) is set to logic one, the storage elements in the storage cells receive the respective ones of signals 332-1 through 332-N. Lock indicator 365 (LOCK) is set to logic one when phase lock is achieved.

When signal 361 (INC) is set to logic one, the storage elements in the storage cells receive the output of an immediately preceding storage cell, thus performing a shift-right operation. When signal 362 (DEC) is set to logic one, the storage elements in the storage cells receive the output of an immediately next storage cell, thus performing a shift-left operation. The shift-left and shift-right operations enable DLL 300 to track input bit-stream 312-1, and to maintain phase-lock between the sampling edge of clock 302 and input 385. Signals 361, 362, 363, 364 and 365 are one-hot encoded. In one-hot encoding, separate bits are used for representing each state or control value type. A value of logic one for a signal (any of 361, 362, 263, 364 and 365) indicates that the corresponding signal is 'active'. Alternatively, a logic value of logic zero may be used to indicate that the corresponding signal is 'active'. Control code generator generates signals 361 through 364 such that only one of the four signals is active in any interval of time, except when lock is achieved, in which condition none of signals 361 through 364 is active, lock indicator 365(LOCK) being activated instead.

The operation of DLL 300 of FIG. 3 is illustrated next with reference to the timing diagram of FIG. 4.

2. Single-Cycle Lock

Figure 4:
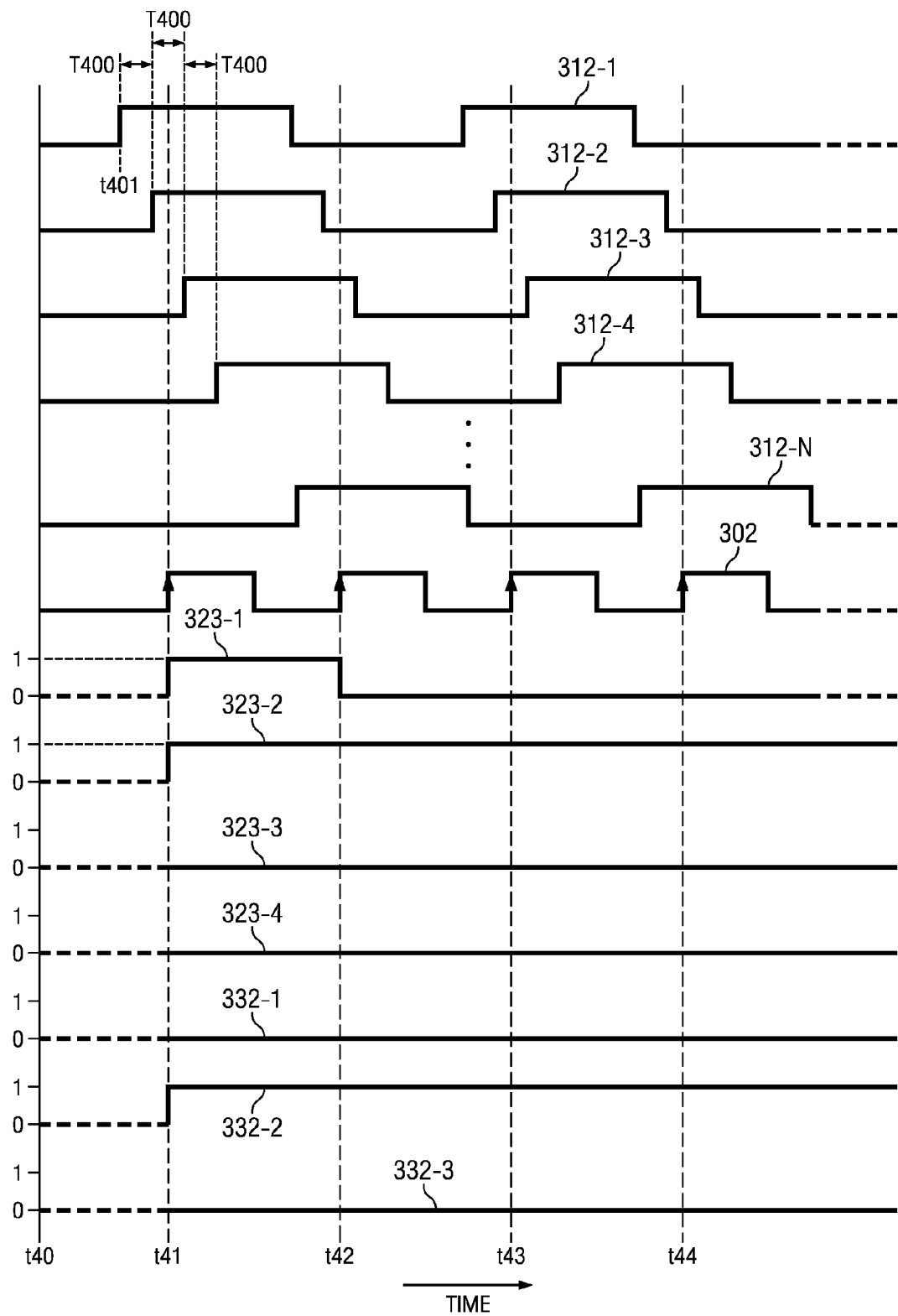
FIG. 4 is an example timing diagram used to illustrate the operation of a DLL in an embodiment.

FIG. 4 is an example timing diagram used to illustrate the operation of DLL 300. Signal 312-1 is assumed to represent an input bit stream that is required to be sampled by clock 302 for data recovery. Delayed input bit-streams 312-2 through 312-N are also shown in FIG. 4. The delay between a pair of successive bit streams on paths 312-1 through 312-N is denoted as T400, which is the delay provided by each delay element 310-1 through 310-N. Time instance t40 is assumed to represent the start of reception of data bits on path 312-1, and may correspond to reception of a signal (not shown) from a component prior to DLL 300 in the receive signal path indicating commencement of data transmission. At the commencement of operations of DLL 300, each of storage cells 320-1 through 320-N is configured (via inputs to the respective multiplexers contained within the storage cells) to sample the data on respective paths 312-1 through 312-N.

Clock 302 is assumed to be generated within DLL 300, and has a frequency equal to (or approximately equal to) the data rate of data bit stream 312-1. However, clock 302 may have an arbitrary phase, i.e., the rising edge of clock 302 may have an arbitrary phase with respect to bit boundaries of data bit stream 312-1. In the interest of conciseness waveforms of only some of the signals of the circuit of FIG. 3 are shown in FIG. 4.

The first active (sampling) edge of clock 302 is shown as occurring at t41. The sampled values at outputs 323-1, 323-2, 323-3 and 323-4 of storage elements 320-1 through 320-4 at sampling edges t41, t42, t43 and t44 are shown in FIG. 4. At t41 only signals 312-1 and 312-2 are at logic 1, and all other signals 312-3 through 312-N are at logic 0. As a result, the corresponding outputs of storage cells 320-1 and 320-2 are logic 1 at t41, while the outputs of all other storage elements (outputs of only 320-3 and 320-4 are shown in FIG. 3) are at logic zero. As a result, output 332-2 of XOR gate 330-2 alone is at logic 1, the outputs of all other XOR gates being at logic 0.

Once storage cells 320-1 through 320-N have sampled the respective inputs at the first rising edge of clock 302 following commencement of operations of DLL 300, the input to the storage element in each of storage cells 320-1 through 320-N is changed to be the output of the respective XOR gate, by setting the values of 361(INC) and 362 (DEC) respectively to logic 0 and logic 1. To clarify, the storage element in storage cell 320-1 receives signal 332-1 as input, the storage element in storage cell 320-2 receives signal 332-2 as input, and so on.

In the example of FIG. 4, therefore, at the next sampling edge of clock 302 at t42, output 323-2 of storage cell 320-2 continues to be at logic 1, and the outputs of all other storage cells (320-1, 320-3 through 320-N) are at logic 0 (only outputs 323-1 through 323-4 are shown in FIG. 4). Output 332-2 of XOR gate 330-2 continues to be at logic 1, while the outputs of all other XOR gates continue to be at logic 0 (only outputs 332-1 through 322-3 are shown in FIG. 4). Tri-state buffers 380-1 through 380-N are enabled/disabled by signals respective 323-1 through 323-N. Hence, tri-state buffer 380-2 is enabled, and all the other tri-state buffers are disabled. Signal 312-2 (which may be viewed as a "selected bit stream" with a delay with respect to clock 302 that has in effect been "determined") is, thus, provided on path 385 as an input to PD 350. In the example, among the input data bit streams (312-1 as well as the delayed bit streams 312-2 through 312-N), the bit boundaries of data bit stream 312-2 are aligned closest with the sampling edge of clock 302, as may also be seen from FIG. 3.

Thus, transition detector 330 may be viewed as operating to determine the delay between the active edge of clock 302 and a bit boundary of input bit stream 312-1, and forwarding the appropriate one of bit streams 312-1 through 312-N to PD 350, the appropriate bit stream being the bit stream from among streams 312-1 through 312-N whose data bit transitions are aligned closest to the sampling edge of clock 302. Normal DLL operation (with memory cells 320-1 through 320-N configured to form a shift register) is performed to maintain phase lock between the clock signal and the selected bit stream (312-1 in the FIG. 4), i.e., residual phase errors (or phase variations over time) between the clock signal and the selected bit stream 312-1 are tracked and corrected to maintain phase lock between the clock signal and stream 312-1.

Further, it may be appreciated that DLL 300 'determines' the delay between the transitions of input 312-1 and sampling edges of clock 302, i.e., delay between t401 and t41 (approximately equal to one T400 unit in the example) and 'corrects' for the delay (by forwarding signal 312-2 to PD 350) within a time interval equal to an interval between a first transition (t401) of the input bit stream and an immediately next active edge (at t41) of clock signal 302.

Since the 'correct' phase (being that of delayed bit stream 312-2 in the example of FIG. 4) of input bit stream 312-1 is determined by t41, the lock-time of DLL 300 as measured from the start (at t401) of toggling of data in the bit stream is less than one clock period of clock 302. Such toggling of data bit stream 312-1 is generally ensured by the presence of synchronization patterns or line coding (e.g., Manchester coding) of the bit stream. Further, since the clock period of clock 302 equals the duration of a data bit in signal 312-1, DLL 300 achieves phase-lock within one cycle (period) of clock 302, such capability of DLL 300 being termed 'single-cycle lock'.

It may be verified that the operation of DLL 300 to achieve phase-lock (within one clock cycle of clock 302) with the edges of input stream 312-1 is ensured irrespective of the specific initial phase delay between the bit boundaries of signal 312-1 and the sampling edges of clock 302. Aligned bit stream 385 and clock 302 may be provided to other components (not shown) in USB receiver 110 for recovery of data.

Once the phase-lock is achieved as illustrated above, PD 350 (in conjunction with control code generator 360) operates to maintain the phase-lock between clock 302 and the aligned bit stream provided on path 385. Accordingly, the implementation details of PD 350 with respect to an example embodiment are described next.

3. Phase Discriminator

Figure 5:
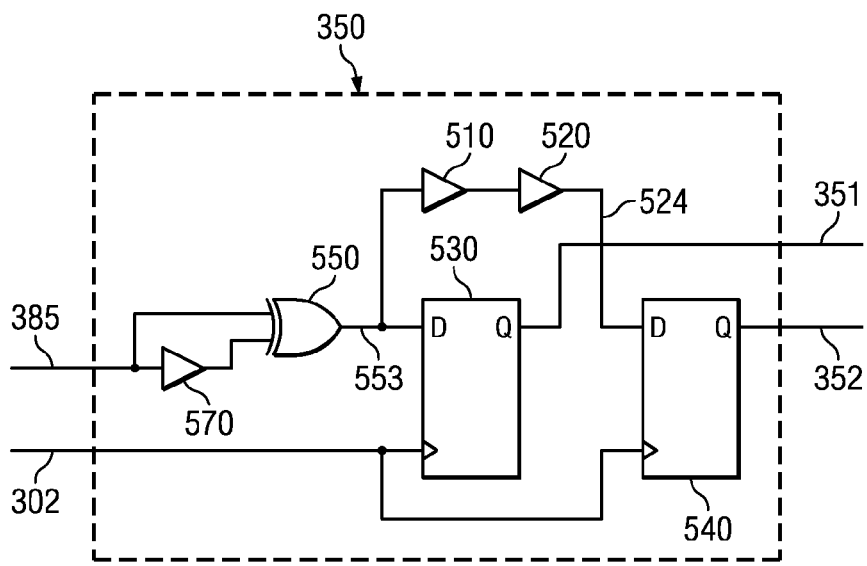
FIG. 5 is a block diagram illustrating the implementation of a phase discriminator used in a DLL, in an embodiment.

FIG. 5 is a block diagram illustrating the implementation of a phase discriminator used in a DLL, in an embodiment. PD 350 is shown containing delay elements 510 and 520, flip-flops 530 and 540, XOR gate 550 and delay buffer 570.

The combination of delay buffer 570 and XOR gate 550 operates as an edge-detector circuit, and generates a logic one at node 553 whenever a transition occurs on signal 385. Signal 553 is provided as the input to flip-flop 530. Delay elements 510 and 520 delay signal 553 and provide a delayed signal 524 to flip-flop 540. The operation of PD 350 is described with reference to the example timing diagrams of FIGS. 6A, 6B and 6C.

Figures 6A, 6B:
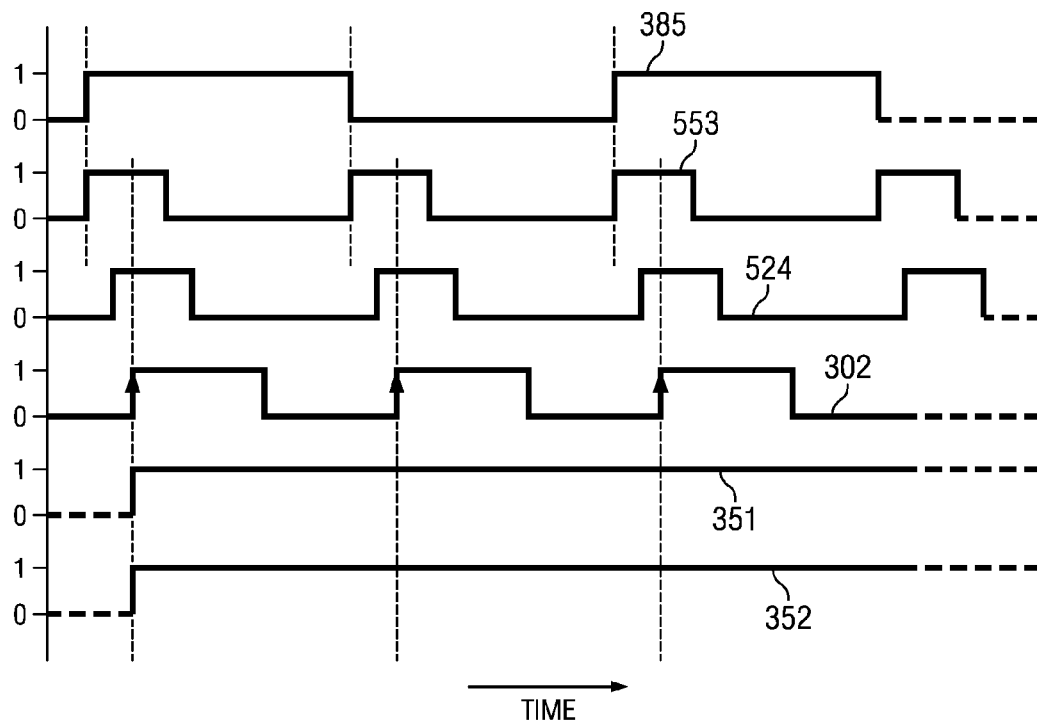
FIGS. 6A, 6B and 6C are example timing diagrams used to illustrate the operation of a DLL, in an embodiment.

In FIG. 6A, signal 385 is shown as transitioning much earlier than the sampling edge of clock 302. Signal 385 corresponds to the data stream among 312-1 through 312-N which is determined to be most closely phase-aligned with the active edge of clock 302, as described above. Each of signals 553 and 524 is at logic 1 at the active edges of clock 302, each of outputs 351 and 352 of PD 350 are at logic 1. A logic value of 1 for each of signals 351 and 352 causes control code generator 360 to activate (e.g., set to a logic 1) increment signal 361. In response, a shift-right operation is performed in sampling circuit 320, with the 'current' outputs of storage elements 320-1 through 320-N being shifted one bit-position to the right. As a result, a data bit stream (one of 312-1 through 312-N) with one additional T400 delay unit (than the 'current' bit stream provided on path 385) is selected as the aligned bit stream on path 385. To illustrate, assuming signal 385 shown in FIG. 6A corresponds to signal 312-2, the right shift operation selects signal 312-3 (which in comparison to signal 312-2 is delayed by one unit (T400)) on path 385. Effectively, the right-shift operation delays the bit stream provided as input 385 to PD 350, thereby further aligning the active edge of clock 302 to the bit boundaries of the input data stream provided on path 385.

On the other hand, and as shown in FIG. 6B, if signal 385 transitions much later than the active edge of clock 302, each of signals 553 and 524 is at logic 0 at the active edges of clock 302, and each of outputs 351 and 352 of PD 350 are also at logic 0. A logic value of 0 for each of signals 351 and 352 causes control code generator 360 to set decrement signal 362 (DEC) to logic 1. In response, a shift-left operation is performed in sampling circuit 320, with the 'current' outputs of storage elements 320-1 through 320-N being shifted one bit-position to the left. As a result, a data bit stream (one of 312-1 through 312-N) with one T400 delay less (than the 'current' bit stream provided on path 385) is selected as the input on path 385. To illustrate, assuming signal 385 shown in FIG. 6B corresponds to signal 312-2, the left shift operation selects signal 312-1 (which in comparison to signal 312-2 is earlier by one unit (T400)) on path 385. Effectively, the left-shift operation advances the data bit stream provided as input 385 to PD 350, thereby further aligning the active edge of clock 302 to the bit boundaries of the input data stream provided on path 385.

Figure 6C:
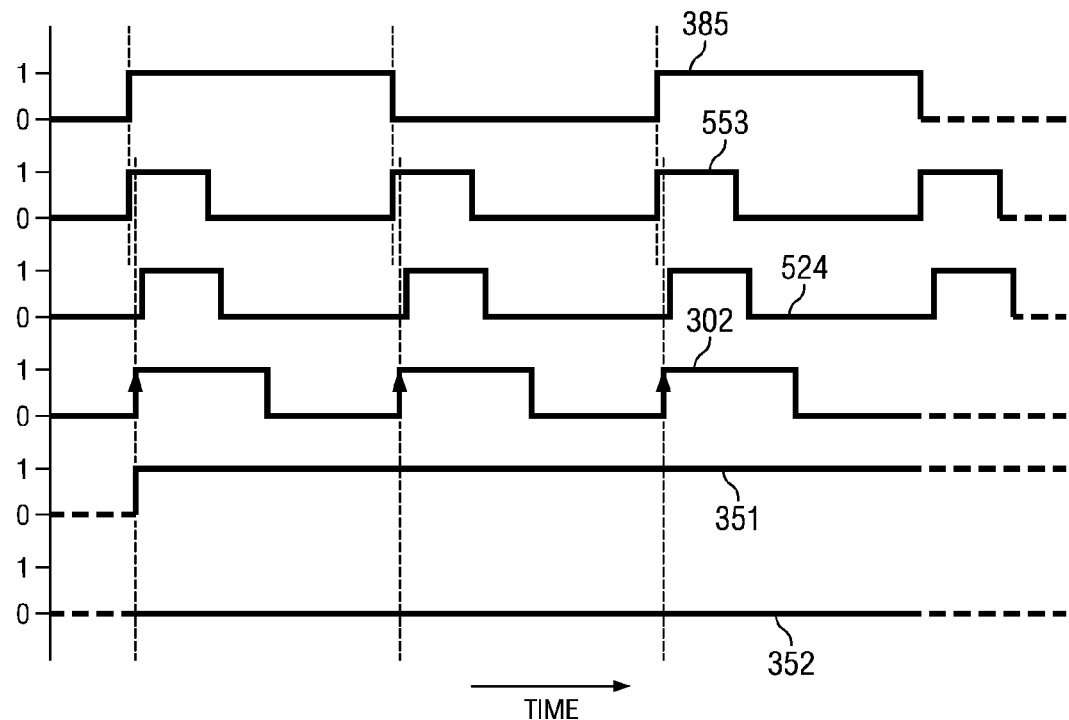

However, as shown in FIG. 6C, if transitions of signal 385 are such that signal 553 is at logic 1 and signal 524 is at logic 0 at the active edges of clock 302, signal 351 is at logic 1 and signal 352 is at logic 0. A logic value of 1 for signal 351 and 0 for signal 352 is deemed to indicate that clock 302 is in phase-lock with signal 385, and causes control code generator 360 to activate (e.g., set to a logic 1) lock indicator signal 363 (LOCK). Also, when signal 351 is at logic 1 and signal 352 is at logic 0, signal 361 (INC) is set to logic 1 and signal 362 (DEC) is set to logic 0. As a result, storage elements in sampling circuit 320 receive the corresponding ones of signals 332-1 through 332-N as inputs.

Thus, PD 350 in conjunction with control code generator 360 operates to maintain lock, and/or provide fine control to effectively steer signal 385 till phase-lock is achieved.

The implementation details of a storage cell used in sampling circuit 320 is described next with respect to an example embodiment.

4. Storage Cell

Figure 7:
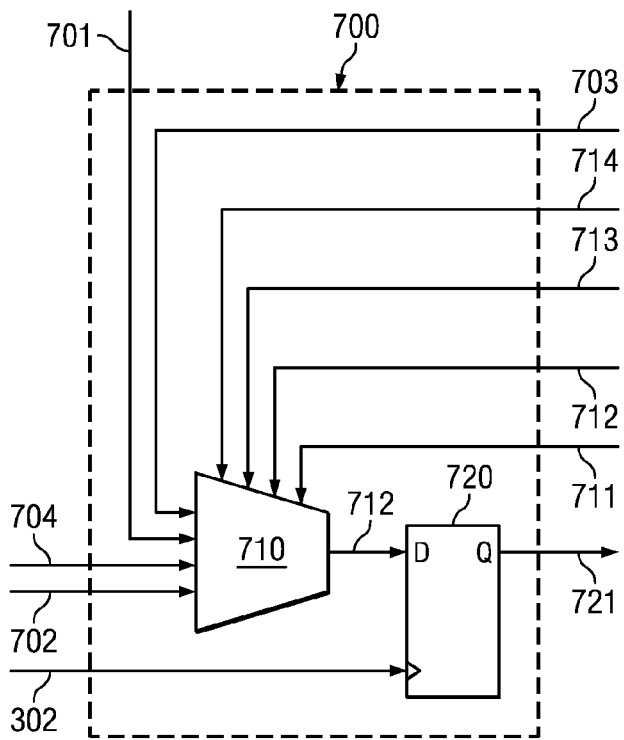
FIG. 7 is a diagram illustrating the implementation details of a storage cell used in a sampling circuit of a DLL, in an embodiment.

FIG. 7 is a diagram illustrating the details of a storage cell used in a sampling circuit in a DLL in an embodiment. Each of storage cells 320-1 through 320-N of sampling circuit 320 of FIG. 3 may be implemented as (or similar to) storage cell 700, which is shown containing multiplexer (MUX) 710 and flip-flop 720.

MUX 710 receives an input data bit stream on path 701, the output of a preceding cell on path 702, the output of a next cell on path 703, and the output of a corresponding XOR gate (shown in FIG. 3) on path 704, and provides one of signals 701, 702, 703 and 704 (plurality of inputs) on path 712 based on the values of select inputs 711, 712, 713 and 714. Assuming storage cell 700 represents 320-2 of FIG. 3, signal/path 701 corresponds to signal/path 312-2, signal/path 702 corresponds to signal/path 323-1 (output of 320-1), signal/path 703 corresponds to signal/path 323-3 (output of 320-3), and signal/path 704 corresponds to signal/path 332-2 (output of XOR 330-2). Select signals 711, 712, 713 and 714 are one-hot encoded signals and correspond respectively to signals 361, 362, 363, 364 of FIG. 3.

DLL 300 is thus an all-digital implementation in the embodiment described with respect to FIG. 3. However, in other embodiments some portions of DLL 300 may be implemented using digital techniques while others may be implemented using analog techniques. Further, while the description above is provided in the context of a clock data recovery (CDR) application, DLL 300 can also be used for other applications such as, for example, to achieve phase-alignment of a local reference clock (path 302 in FIG. 3) with an input clock (received on path 312-1 of FIG. 3), and for generation of multiple clock phases (on paths 323-1 through 323-N). DLL 300 can thus be used both as a delay locked loop as well as a clock data recovery circuit.

DLL 300, implemented as described above, provides several benefits. Since the lock-time of DLL 300 is short (typically equal to one cycle of clock 302), DLL 300 may be used as a clock data recovery (CDR) circuit to achieve fast lock with an input data stream, thereby enabling reliable data recovery even at high data rates, or when the synchronization pattern does not contain a large number of bits.

Once phase-lock is achieved, portions of delay chain 310, sampling circuit 320 and transition detector 330 can be powered-down, leading to power savings. For example, assuming that active edges of clock 302 are determined to be aligned to the transitions of signal 312-3, and phase-lock has been achieved, delay elements 310-4 through 310-N, provision of clock 302 to all storage elements can be stopped (by corresponding techniques, well-known in the relevant art), all of gates 330-1 through 330-N can be powered down, tri-state buffers 380-1 and 380-3 through 380-N can be tri-stated, while the other portions continue to operate to maintain lock (tracking operation).

While path 302 is noted in the description above as receiving a clock and path 312-1 as receiving an input data stream, it is noted that the signals provided to the paths may be interchanged, with the clock being provided on path 312-1 and the data stream on path 302, with DLL 300 still operating to provide the same functionality as described in detail above.

While various embodiments of the present disclosure have been described above, it should be understood that they have been presented by way of example only, and not limitation. Thus, the breadth and scope of the present disclosure should not be limited by any of the above-described embodiments, but should be defined only in accordance with the following claims and their equivalents.

What is claimed is:

1. A delay locked loop (DLL) comprising:
   a plurality of delay elements, each delay element to provide a delay to an input bit stream, and to generate a plurality of delayed input bit streams;
   a sampling circuit comprising a plurality of memory cells including a first memory cell, the first memory cell to receive the input bit stream and each of the other memory cells in the plurality of memory cells to receive a corresponding one of the delayed input bit streams, the plurality of memory cells to sample a corresponding one of the plurality of delayed input bit streams and the input bit stream at an active edge of a clock signal to generate corresponding sampled outputs;
   a plurality of logic gates, each to receive a corresponding pair of outputs comprised in the corresponding sampled outputs to determine a delay between the active edge of the clock signal and a bit boundary of the input bit stream within a time interval equal to an interval between a first transition of the input bit stream and a subsequent active edge of the clock signal, outputs of the logic gates selecting from the input bit stream and the plurality of delayed input bit streams a selected bit stream with the determined delay; and a phase discriminator to compare a phase of the selected bit stream with a phase of the clock signal, and to generate an error signal representing a phase difference between the phase of the selected bit stream and the phase of the clock signal, wherein the error signal is coupled to the sampling circuit to maintain phase lock between the clock signal and the selected bit stream.

2. The DLL of claim 1, wherein the subsequent active edge is an edge immediately following the first transition of the input bit stream, the DLL further comprising:

a plurality of tri-state gates, each receiving a corresponding bit stream comprised in the input bit stream and the plurality of delayed input bit streams as an input, and the output of a corresponding one of the plurality of memory cells as an output-enable signal, wherein the outputs of the plurality of tri-state gates are coupled with each other on a first input path to the phase discriminator and provided as an input to the phase discriminator, wherein only one of the outputs of the logic gates is at a logic level that enables the output of a corresponding one of the plurality of tri-state gates to be provided as the input to the phase discriminator.

3. The DLL of claim 2, further comprising:

a control code generator to receive the error signal, and to generate corresponding digital control signals to select and provide one of a plurality of inputs to each memory cell in the plurality of memory cells.

4. The DLL of claim 3, wherein each of the digital control signals is one-hot encoded.

5. The DLL of claim 4 wherein each memory cell in the plurality of memory cells comprises a multiplexer and a flip-flop, wherein flip-flops in the memory cells are each clocked by the clock signal, wherein a multiplexer in a first memory cell in the plurality of memory cells receives a plurality of inputs, and provides a selected one of the plurality of inputs as an input to the flip-flop in the first memory cell based on which one of the digital control signals is active, wherein the inputs comprise:

a corresponding one of the plurality of delayed input bit streams and the input bit stream;

an output of an immediately preceding memory cell;

an output of an immediately next memory cell; and an output of a corresponding logic gate in the plurality of logic gates, wherein the digital control signals comprise an increment signal, a decrement signal, a sample signal, and a transition-detect signal.

6. The DLL of claim 5, wherein the phase discriminator comprises:

an edge detector circuit to receive the output on the first input path to the phase discriminator and to generate an input pulse;

a second flip flop to receive the input pulse on a data input and the clock signal on a clock input, the output of the second flip-flop being provided as a first error signal;

a pair of delay buffers to receive the input pulse and provide a delayed pulse; and a third flip flop to receive the delayed pulse on a data input and the clock signal on a clock input, the output of the third flip-flop being provided as a second error signal, wherein the first error signal and the second error signal together constitute the error signal.

7. The DLL of claim 6, wherein each logic gate in the plurality of logic gates is an exclusive-OR (XOR) gate.

8. The DLL of claim 2, wherein the input bit stream conforms to the universal serial bus (USB) protocol.

9. A device comprising:

a processor; and a receiver to process an input bit stream to recover data, and to provide the data to the processor, wherein the receiver comprises a delay locked loop (DLL), the DLL comprising:

a delay chain to receive an input bit stream and to generate a plurality of delayed bit streams;

a sampling circuit to sample and store values of the input bit stream and the plurality of delayed bit streams at an active edge of a clock signal;

a transition detector to receive the stored values and to determine a delay between the active edge of the clock signal and a bit boundary of the input bit stream within a time interval equal to an interval between a first transition of the input bit stream and a subsequent active edge of the clock signal, the transition detector to select from the input bit stream and the plurality of delayed input bit streams a selected bit stream with the determined delay; and a phase discriminator to compare a phase of the selected bit stream with a phase of the clock signal, and to generate an error signal representing a phase difference between the phase of the selected bit stream and the phase of the clock signal, wherein the error signal is coupled to the sampling circuit to maintain phase lock between the clock signal and the selected bit stream.

10. The device of claim 9, wherein the DLL further comprises:

a plurality of tri-state gates, each coupled to receive a corresponding bit stream comprised in the input bit stream and the second plurality of delayed input bit streams as an input, and a corresponding one of the stored values as an output-enable signal, wherein the outputs of the plurality of tri-state gates are coupled together and provided as an input to the phase discriminator.

11. The device of claim 10, wherein the DLL further comprises:

a control code generator to receive the error signal, and to generate digital control signals to select and provide one of a plurality of inputs to each of a plurality of memory cells comprised in the sampling circuit.

12. The device of claim 11, wherein each of the digital control signals is one-hot encoded.

13. The device of claim 12 wherein each memory cell in the plurality of memory cells comprises a multiplexer and a flip-flop, wherein flip-flops in the memory cells are each clocked by the clock signal, wherein a multiplexer in a first memory cell in the plurality of memory cells receives a plurality of inputs, and provides a selected one of the plurality of inputs as an input to the flip-flop in the first memory cell based on which one of the digital control signals is active, wherein the inputs comprise:

a corresponding one of the plurality of delayed input bit streams and the input bit stream;
an output of an immediately preceding memory cell;
an output of an immediately next memory cell; and
an output of a corresponding logic gate comprised in the transition detector,
wherein the digital control signals comprise an increment signal, a decrement signal, a sample signal, and a transition-detect signal.

14. The device of claim 13, wherein the phase discriminator comprises:
an edge detector circuit to receive the output on the first input path to the phase discriminator and to generate an input pulse;
a second flip flop to receive the input pulse on a data input and the clock signal on a clock input, the output of the second flip-flop being provided as a first error signal;
a pair of delay buffers to receive the input pulse and provide a delayed pulse; and
a third flip flop to receive the delayed pulse on a data input and the clock signal on a clock input, the output of the third flip-flop being provided as a second error signal,
wherein the first error signal and the second error signal together constitute the error signal.

15. The device of claim 14, wherein the transition detector comprises a plurality of exclusive-OR (XOR) gates.

16. The device of claim 10, wherein the input bit stream conforms to the universal serial bus (USB) protocol.

17. A delay locked loop (DLL) comprising:
a plurality of delay elements to generate a plurality of delayed input bit streams from an input bit stream;
a sampling circuit comprising a plurality of memory cells including a first memory cell, the first memory cell to receive the input bit stream and each of the other memory cells in the plurality of memory cells to receive a corresponding one of the delayed input bit streams, the plurality of memory cells to sample a corresponding one of the plurality of delayed input bit streams and the input bit stream at an active edge of a clock signal to generate corresponding sampled outputs;
a plurality of logic gates, each to receive a corresponding pair of outputs comprised in the corresponding sampled outputs to determine a delay between the active edge of the clock signal and a bit boundary of the input bit stream within a time interval equal to an interval between a first transition of the input bit stream and an immediately next active edge of the clock signal, outputs of the logic gates selecting from the input bit stream and the plurality of delayed input bit streams a selected bit stream with the determined delay; and
a plurality of tri-state gates, each receiving a corresponding bit stream comprised in the input bit stream and the plurality of delayed input bit streams as an input, and the output of a corresponding one of the plurality of memory cells as an output-enable signal, wherein the outputs of the plurality of tri-state gates are coupled with each other on a first input path to the phase discriminator and provided as an input to the phase discriminator, wherein only one of the outputs of the logic gates is at a logic level that enables the output of a corresponding one of the plurality of tri-state gates to be provided as the input to the phase discriminator; and
a phase discriminator to compare the phase of the selected bit stream with the phase of the clock signal, and to generate an error signal representing the phase difference between the phase of the selected bit stream and the phase of the clock signal,
wherein the error signal is coupled to each memory cell in the plurality of memory cells,
wherein, subsequent to the selection of the selected bit stream, memory cells in the plurality of memory cells are configured to operate as a shift register to enable the DLL to track residual phase errors between the clock signal and the selected bit stream.

* * * * *